(12) United States Patent
Hiblot et al.

(10) Patent No.: US 10,998,413 B2
(45) Date of Patent: May 4, 2021

(54) SEMICONDUCTOR FIN STRUCTURES HAVING SILICIDED PORTIONS

(71) Applicant: IMEC vzw, Leuven (BE)

(72) Inventors: Gaspard Hiblot, Leuven (BE); Sylvain Baudot, Woluwe Saint-Pierre (BE); Geert Van der Plas, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/711,258

(22) Filed: Dec. 11, 2019

(65) Prior Publication Data

US 2020/0194567 A1    Jun. 18, 2020

(30) Foreign Application Priority Data

Dec. 13, 2018    (EP) ..................................... 18212336

(51) Int. Cl.
*H01L 21/8234* (2006.01)
*H01L 29/45* (2006.01)
(Continued)

(52) U.S. Cl.
CPC ...... *H01L 29/456* (2013.01); *H01L 21/76224* (2013.01); *H01L 21/823418* (2013.01); *H01L 21/823431* (2013.01); *H01L 21/823481* (2013.01); *H01L 27/0886* (2013.01); *H01L 29/0847* (2013.01); *H01L 29/41791* (2013.01);
(Continued)

(58) Field of Classification Search
CPC ......... H01L 21/823431; H01L 27/0886; H01L 29/41791; H01L 29/66795; H01L 2029/7858
See application file for complete search history.

(56) References Cited

U.S. PATENT DOCUMENTS 5,155,563 A    10/1992    Davies et al.
6,495,454 B2    12/2002    Livengood et al.
(Continued)

FOREIGN PATENT DOCUMENTS

WO    WO 2017/052626 A1    3/2017
WO    WO 2017/052630 A1    3/2017
(Continued)

OTHER PUBLICATIONS

Extended Search Report issued in EP patent application No. 18212336.4, dated Jun. 26, 2019.

*Primary Examiner* — George R Fourson, III
(74) *Attorney, Agent, or Firm* — Knobbe, Martens, Olson & Bear, LLP

(57) ABSTRACT

The disclosed technology relates generally to integrated circuit structures, and more particularly to a semiconductor fin structure having silicided portions. In an aspect, a semiconductor device including a fin structure and a substrate is disclosed. The fin structure includes a first source/drain region, a second source/drain region, and a channel region. The channel region is arranged between the first source/drain region and the second source/drain region to separate the first source/drain region and the second source/drain region in a length direction of the fin structure. The first source/drain region includes a bottom portion and a top portion, wherein the bottom portion of the first source/drain region is fully silicided and the top portion of the first source/drain region is partly silicided.

19 Claims, 4 Drawing Sheets

(51) Int. Cl.
   *H01L 21/762*   (2006.01)
   *H01L 27/088*   (2006.01)
   *H01L 29/08*   (2006.01)
   *H01L 29/417*   (2006.01)
   *H01L 29/66*   (2006.01)
   *H01L 29/78*   (2006.01)
   *H01L 21/02*   (2006.01)
   *H01L 21/311*   (2006.01)

(52) U.S. Cl.
   CPC ...... *H01L 29/665* (2013.01); *H01L 29/66795* (2013.01); *H01L 29/7851* (2013.01); *H01L 21/02129* (2013.01); *H01L 21/31111* (2013.01)

(56) References Cited

U.S. PATENT DOCUMENTS

| | | |
|---|---|---|
| 6,838,332 B1 | 1/2005 | Sanchez et al. |
| 7,402,866 B2 | 7/2008 | Liang et al. |
| 7,816,231 B2 | 10/2010 | Dryer et al. |
| 8,373,228 B2 | 2/2013 | Yang et al. |
| 8,637,358 B1 | 1/2014 | Koburger, III et al. |
| 8,841,189 B1 | 9/2014 | Cheng et al. |
| 9,305,974 B1* | 4/2016 | Liu ................... H01L 27/2463 |
| 9,385,201 B2 | 7/2016 | Liu et al. |
| 9,543,397 B2 | 1/2017 | Kleemeier et al. |
| 10,043,746 B1* | 8/2018 | Cheng ................. H01L 21/3086 |
| 10,868,178 B2* | 12/2020 | Liu ..................... H01L 29/7848 |
| 2005/0045965 A1* | 3/2005 | Lin ................... H01L 29/66795 257/384 |
| 2007/0111435 A1* | 5/2007 | Kim ................... H01L 29/41791 438/253 |
| 2010/0276761 A1 | 11/2010 | Tung et al. |
| 2010/0295120 A1* | 11/2010 | Sandhu ............... H01L 27/2454 257/329 |
| 2011/0001169 A1* | 1/2011 | Ozcan ............... H01L 29/41791 257/213 |
| 2011/0241073 A1 | 10/2011 | Cohen et al. |
| 2014/0264634 A1* | 9/2014 | Lee ................... H01L 29/7854 257/407 |
| 2015/0214105 A1 | 7/2015 | Zhang et al. |
| 2016/0322475 A1* | 11/2016 | Leobandung ......... H01L 29/452 |
| 2019/0312117 A1* | 10/2019 | Qi ..................... H01L 21/30604 |
| 2019/0355717 A1* | 11/2019 | Zhou ............... H01L 21/823828 |

FOREIGN PATENT DOCUMENTS

| | | |
|---|---|---|
| WO | WO 2017/052638 A1 | 3/2017 |
| WO | WO 2018/004653 A1 | 1/2018 |

\* cited by examiner

SEMICONDUCTOR FIN STRUCTURES HAVING SILICIDED PORTIONS

CROSS-REFERENCE TO RELATED APPLICATIONS

This application claims foreign priority to European Application No. EP 18212336.4, filed on Dec. 13, 2018, the content of which is incorporated by reference herein in its entirety.

BACKGROUND

Field

The present disclosed technology relates generally to integrated circuit structures, and more particularly to a semiconductor fin structure having silicided portions.

Description of the Related Technology

For the operation of integrated circuits, power is supplied and distributed appropriately. With the ever increasing demand for smaller and more densely packed circuits, the challenges in design complexity and power routing has increased dramatically.

One attempt to address these challenges has been to introduce a backside interconnect structure to deliver power through the substrate to the front side of the integrated circuit. This technology employs a power distribution network, formed on the backside of the substrate, and a series of deep vias through the substrate to couple the power planes to front side metal lines.

Even though such technology may reduce the footprint of the integrated circuit, an improved technology for supplying semiconductor devices with power may be beneficial.

SUMMARY OF CERTAIN INVENTIVE ASPECTS

The disclosed technology generally relates to a semiconductor device, and a method for forming the device, where the device has an improved power routing.

According to aspects of the disclosed technology there may be provided a semiconductor device including a fin structure and a substrate, the fin structure includes a first source/drain region, a second source/drain region, and a channel region. The channel region may be arranged between the first source/drain region and the second source/drain region to separate the first source/drain region and the second source/drain region in a length direction of the fin structure. Further, the first source/drain region includes a bottom portion and a top portion, the bottom portion may be arranged between the top portion and the substrate such that it shares a common boundary with the top portion. The bottom portion is fully silicided, whereas the top portion is partly silicided.

In other aspects, a method for forming a semiconductor device may be provided. The method includes: forming a fin structure having a first source/drain region, a second source/drain region and a channel region, the channel region is arranged between the first source/drain region and the second source/drain region, thereby separating the first source/drain region and the second source/drain region in a length direction of the fin structure, and the first source/drain region includes a bottom portion and a top portion, the bottom portion being arranged between the top portion and a substrate of the semiconductor device and such that the bottom portion shares a common boundary with the top portion; depositing a first metal on the top portion of the first source/drain region; annealing a material of the top portion of the first source/drain region such that the first metal reacts with the material of the top portion such that the top portion of the first source/drain region is partly silicided; providing a second metal on the bottom portion of the first source/drain region; and annealing a material of the bottom portion of the first source/drain region such that the second silicidation metal reacts with the material of the bottom portion such that the bottom portion of the first source/drain region is fully silicided.

The disclosed technology allows for the fin to be electrically contacted from below without having to go through a routing structure connecting the fin from the top. This allows for a more densely packed circuit, as the space otherwise used for the vertical routing between a backside interconnect structure and the top of the fin can be saved. Further, the direct connection to the bottom of the fin eliminates the resistance and parasitic capacitance associated with the routing to the top of the fin.

Electrically contacting of the fin from below benefits from the full silicidation of the bottom portion of the first source/drain region and the partial silicidation of the top portion of the first source/drain region. The fully silicided bottom portion of the first source/drain region may form a landing pad for backside connections and may be used to bias the first source/drain region, whereas the partially silicided top portion of the first source/drain region provides a large contact area to the fin and thus reduce interface resistance.

The fin structure may include an active part or a device part formed by at least a part of the top portion. The active part may be defined by the part of the fin that protrudes from an isolating structure, such as for example a shallow trench isolation (STI), and may constitute only a fraction of the total fin height as measured from the substrate. The bottom portion may be arranged under the active part, as seen from above the fin in a direction towards the substrate, and preferably in contact with the substrate. The top portion of the fin may be arranged directly on the bottom portion, such that the top portion and the bottom portion share a common boundary. In fact, the top portion and the bottom portion may be formed from the same fin structure, and be defined by the difference in degree of silicidation. The part of the fin that is fully silicided may be referred to as the bottom portion, whereas the part of the fin that is only partly silicided may be referred to as the top portion.

The distance from the substrate to the top of the fin, as seen in an orthogonal direction from the substrate, may be referred to as the height of the fin, whereas the horizontal extension of the fin along a surface of the substrate may be referred to as the length of the fin. The fin may have a uniform height, or a height that varies along its length. Similarly, the height of the device part protruding from the isolating structure (if any), may either be uniform or vary along the length of the fin. The top and bottom portions may be aligned above each other in the height direction of the fin, whereas the first source/drain region, channel region and the second source/drain region, which all may be formed in the device part of the fin, may be aligned after each other in the length direction of the fin.

The terms 'source/drain region' and 'channel region' relate to the parts of the fin in which the corresponding terminals of a transistor may be formed. It is therefore appreciated that the actual source/drain and channel of the resulting transistor device may form only a part of the source/drain and channel regions of the fin structure—the latter region may be referring to different parts or regions of the fin structure, and not necessarily to the terminals of the transistor.

The source/drain and channel of the transistor, which may be formed by parts of the material of the source/drain region and the channel region of the fin structure, may be connected to electrical contacting or connecting structures. The electrical contacting structure coupled to the channel may be referred to as a gate or a gate contact, and may be used for modulating the channel conductivity.

In the disclosed technology, the electrical contacting structure at the first source/drain region is at least partly formed by the silicide of the fin structure.

The electrical contacting structures may include horizontal conductive lines and vertical conductive vias or metal vias that may provide the signal routing for operating the transistors.

As used herein, the term 'horizontal' denotes a direction parallel to a main plane of extension or a main surface, whereas the term 'vertical' denotes a direction transverse to the main plane of extension of the substrate. Accordingly, the terms 'top' and 'above' refer to a direction away from the substrate, along the vertical direction, whereas the terms 'bottom' and 'below' refers to a direction towards the substrate, along the vertical direction.

The term 'fully silicided' refers to a part of the fin structure being silicided all the way through the fin, such that not only the outer surfaces of the fin part has reacted with a metal to form a silicide, but also all the material within the fin part. The term 'partly silicided', refers to a part of the fin structure in which some of the material has reacted with a metal. In some embodiments, the outer surfaces of the fin part reacts with the metal, leaving at least some of the material within the fin part unaffected. The silicide may form a layer on the outside of the partly silicided portion. An inner portion of the fin part may have a lower concentration of metal than the outer surface of the fin part.

In the above, the top portion of the first source/drain region is described as partly silicided. It will however be appreciated that also the top portion of the second source/drain region may be partly silicided as well, so as to facilitate contacting from above.

According to an embodiment, the semiconductor device may further include a first connecting structure for electrically contacting at least a part of the bottom portion of the first source/drain region, and a second connecting structure for electrically contacting at least a part of the top portion of the second source/drain region. The first connecting structure may include a trench or through silicon via, formed in the substrate and landing on the fully silicided bottom portion of the first source/drain region, for providing an electrical connection to a backside contacting structure such as a power distribution network (PDN). The first connecting structure may thus be arranged to contact the fully silicided bottom portion of the first source/drain region from below, e.g., the side of the fin facing the substrate, whereas the second connecting structure may be arranged to contact the second source/drain region from above, e.g., the side of the fin facing away from the substrate.

As previously mentioned, the partly silicided portion(s) of the fin structure may include an outer layer of silicide. In other words, the silicidation of those parts may be provided in the form of an outer layer of the fin, whereas at least part of the material of the fin structure arranged inside the layer is not silicided. It should be noted that the silicided outer layer may not cover the entire surface of the first source/drain region. The silicided layer may cover a surface portion that defines a contact area sufficiently large to provide a proper, functional contacting of the source/drain region of the fin.

In some embodiments, the top portion of the first source/drain region may be arranged to fully overlap the bottom portion of the first source/drain region, as seen in a height direction of the fin structure. This allows for the top portion to be electrically connected from below through the underlying, fully silicided bottom portion of the first source/drain region, which may be considered as vertically aligned with the top portion.

In some embodiments, the substrate may comprise a well that is doped with a dopant of a first type. Further, a region of the well sharing a common boundary with the bottom portion of the first source/drain region may comprise a higher dopant concentration than the remaining regions of the well. The higher dopant concentration allows for a reduced electrical resistance between the substrate and the fin structure. By using a well, the fin structure can be connected to the substrate without using any tap cells. Further, the top portion of the first and second source/drain regions, i.e., the partly silicided portions, may be doped with a dopant of a second type.

The doping of the well may be done by forming a recess in the substrate, adjacent to the fin structure, and at least partly filling the recess with a doped oxide. The bottom portion of the first source/drain region may be doped in a solid-phase diffusion process.

In some embodiments, at least a part of the top portion of the second source/drain region may be provided with an epitaxial contacting structure. The epitaxial contacting structure may form part of the second connecting structure for providing a routing from above, and may in some examples be provided with an outer layer of silicide so as to facilitate electrical connection and reduce interface resistance.

The partly and fully silicided portions of the fin structure may be provided in a two-part silicidation process, in which the first metal is deposited on the top portion of the first source in a first silicidation step and the second metal is provided on the bottom portion of the first source/drain region of the fin structure in a second silicidation step. In some embodiments, the second metal is provided by forming a recess exposing sidewalls of the bottom portion, and depositing the second silicidation metal in the recess. The recess may be formed in an STI arranged above the substrate.

In some embodiments, the method may further comprise a step of removing the first metal from portion of the fin structure that have not been silicided. The unreacted metal may be removed so as to avoid short circuits between different silicided portions.

In some embodiments, reacting the second metal may be performed after an inter-layer dielectric (ILD) has been provided, so as to prevent the fin from collapsing during the silicidation process.

BRIEF DESCRIPTION OF THE DRAWINGS

The above, as well as additional objects, features and advantages of the disclosed technology, will be better understood through the following illustrative and non-limiting detailed description, with reference to the drawings. In the drawings like reference numerals will be used for like elements unless stated otherwise.

DETAILED DESCRIPTION OF CERTAIN ILLUSTRATIVE EMBODIMENTS

Figure 1:
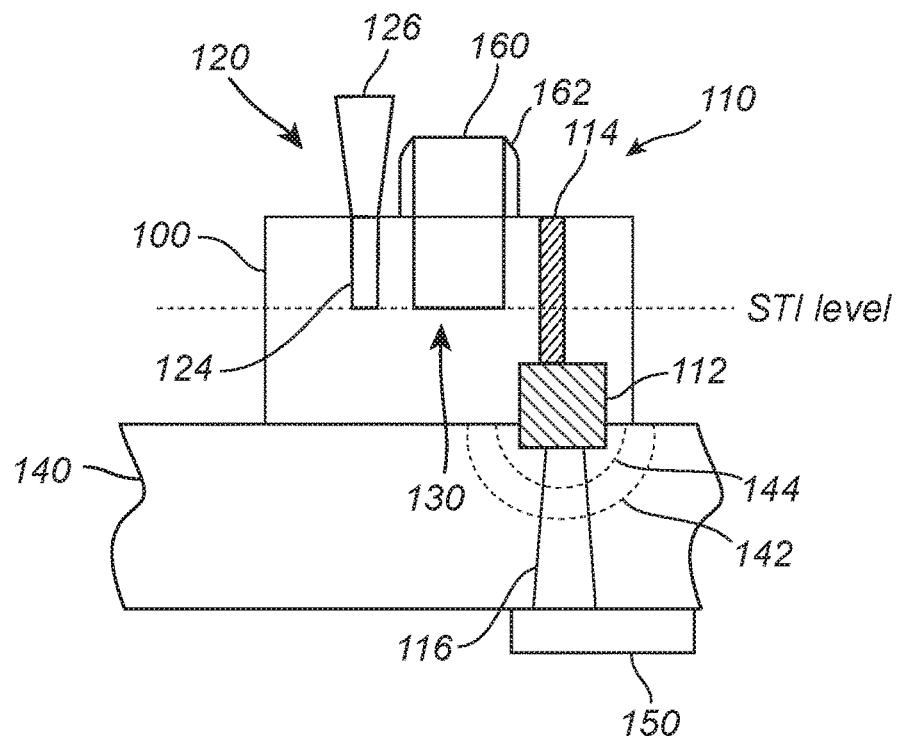
FIG. 1 is a schematic cross section taken along an exemplary fin structure.

FIG. 1 is a cross section taken along a semiconductor device according to an embodiment of the disclosed technology. It should be noted that, owing to the schematic nature of the drawings, the relative dimensions of the various structures and layers are not drawn to scale. Rather the dimensions have been adapted for illustrational clarity and to facilitate understanding of the following description.

The semiconductor device according to the present example illustrated in FIG. 1 includes a fin structure 100 supported by a substrate 140. The fin structure includes a first source/drain region 110, a second source/drain region 120, and a channel region 130 arranged between the first source/drain region 110 and the second source/drain region 120 as seen in a length direction of the fin structure 100. Even though only one fin structure is illustrated in the present figure, it will be appreciated that the resulting semiconductor device may comprise a plurality of fin structure, which can be arranged parallel to each other. The fin structure(s) 100 may be formed by a fin pattering and fin cut process of the substrate 140.

The fin structure 100 may be at least partly embedded in a shallow trench isolation (STI), such that only a portion of the fin structure 100 protrudes from the surface of the STI. The level of the STI surface in indicated by the dashed line in FIG. 1. The protruding portion of the fin structure 100 may be referred to as an active portion or a device portion. The final device may be a transistor device including a source, a drain and a gate terminal, and may be formed in the device portion.

The first source/drain region 110 of the fin structure 100 may include a bottom portion 112, arranged in the portion of the fin closest to the substrate 140, and a top portion 114. The top portion 114 may thus be arranged on top of the bottom portion 112 such that the top portion 114 and the bottom portion 112 shares a common boundary or interface. In the present example, the bottom portion 112 of the first source/drain region 110 is fully silicided, whereas the top portion 114 is partly silicided. Therefore, the bottom portion 112 may include a silicide that extends all the way through the entire width of the fin structure 100, whereas the top portion 114 may include a silicide provided in the form of an outer layer on the fin structure (illustrated by the shaded area 114 in FIG. 2). In the illustrated embodiment, the combination of the top portion 114 and the bottom portion traverse the entire height of the fin structure 100. According to some embodiments, the bottom portion 112 and the top portion 114 are separately formed portions. For example, in the illustrated embodiment, the bottom portion 112 and the top portion 114 have different lateral dimensions.

The substrate 140 may be doped to form a well 142 under the fin structure 100, and contacting the first source/drain region 110 shown in FIG. 1. In the well 142, a region 144 of higher dopant concentration may be formed so as to improve the electrical connection between the fin structure 100 and the silicon of the well 140. The region 144 may hence be arranged such that it shares a common boundary with the silicide of the bottom portion 112 of the first source/drain region 110. The silicide of the bottom portion 112 may reach slightly into the substrate 140 due to the nature of the silicidation process, which may consume some of the silicon of the substrate 140.

A first connecting structure 116, such as a trench or via filled with a metal or another electrically conductive material, may be arranged to connect the bottom portion 112 of the fin structure 100 from below. In the present example of FIG. 1, the trench is arranged under the first source/drain region 110 and extends through the substrate 140 so as to connect the first source/drain region 110 to a backside power distribution network (PDN) 150.

The second source/drain region 120 may comprise a top portion 124 that is electrically connected to a second connecting structure 126, such as an interconnecting via or a metal line, for connecting the second source/drain region 120 from above.

The channel region 130 may be controlled by a gate electrode 160, separated from the surrounding structures such as the second connecting structure 126 by sidewall spacers 162. During operation of the transistor device, the gate electrode 160 may be used for controlling the flow of electrical carriers between the first source/drain region 110 and the second source/drain region 120.

Figure 2:
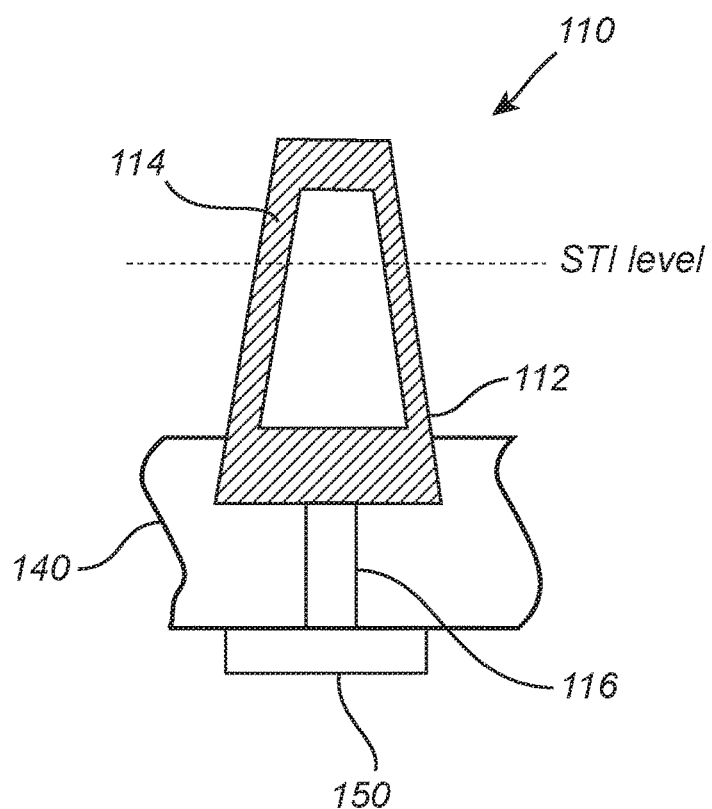
FIG. 2 is a schematic cross section taken across the first source/drain region of an exemplary fin structure.

FIG. 2 is a schematic illustration of a cross section, taken across the first source/drain region 110 of a semiconductor device that may be similarly configured as the example discussed in connection with FIG. 1. The present cross section illustrates an example of a fin structure 100 wherein the bottom portion 112 is fully silicided and the top portion 114 only partly silicided. The silicide is indicated by the shaded areas. The partly silicided top portion 114 comprises a silicide provided as a layer arranged on the outer surface of the first source/drain region 110, while the inner regions of the top portion can be substantially unsilicided by the metal. However, embodiments are not so limited and the inner regions can also be silicided by a metal. However, when the inner regions are not fully silicided, they have a different concentration of metal, e.g., lower, compared to the outer regions.

The fully silicided bottom portion 112, which hence may be considered as transformed into a silicide material, provides a landing pad for the trench 116 that connects the first source/drain region 110 from below—in the present example to a PDN 150. The silicided surface of the top portion 114 provides an electrical contact for the active top part of the first source/drain region, allowing the source/drain region of the transistor device formed in the fin to be powered from the substrate rather than from a back end of the line (BEOL) side or side opposite to the substrate.

A method for forming a semiconductor device, which may be similarly configured as the device illustrated in FIGS. 1 and 2, will now be discussed with reference to FIGS. 3 to 7.

Figure 3:
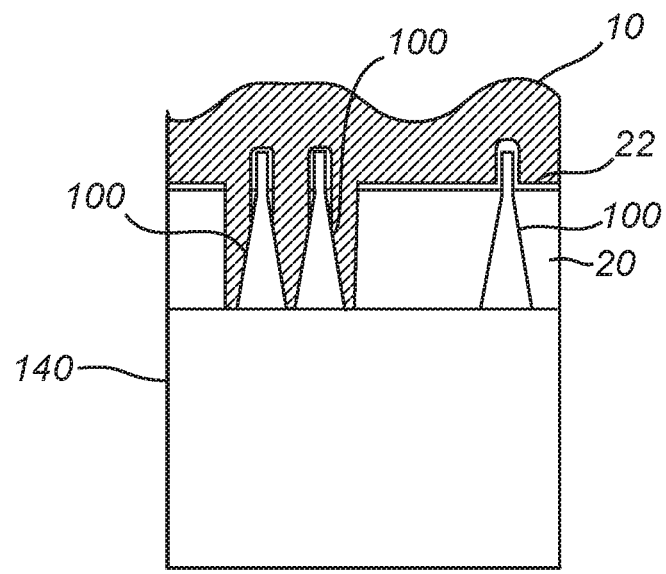
FIGS. 3-7 schematically illustrate a method for forming a semiconductor device comprising an exemplary fin structure.

At the stage of the method shown in FIG. 3, three parallel fin structures 100 have been provided. The fin structures 100 are supported by a substrate 140, which may be a semiconductor substrate such as a silicon substrate 140. The semiconductor substrate may also be a germanium substrate or a SiGeOI substrate, a SiC substrate, a SOI substrate, or a GeOI substrate.

The fin structures 100 can be formed by a cut etch forming trenches that define the fin structures 100. An STI layer 20 may be formed such that only an uppermost portion of the fin structures 100 protrude from the surface of the STI layer 20. In the present figure, the STI layer 20 have been etched away from two of the fin structures 100, so as to expose the first source/drain regions 110 that are to be processed in the following illustrating disclosure.

As shown in FIG. 3, a dopant material, such as phosphorus-silicate glass (PSG) 10, may be conformally deposited over the structure.

Figure 4:
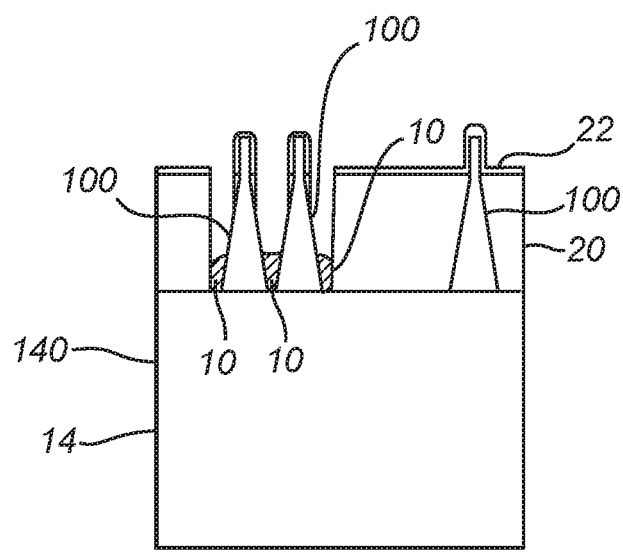

The PSG 10 may then be recessed, for example by dry etching or wet etching, until the PSG 10 remains at the bottom of the two exposed fin structures 100. The result is shown in FIG. 4. The remaining structures, such as the STI layer 20 and the third fin structure 100, may be protected by a layer of e.g. silicon nitride, acting as a stopping layer for the etch process.

Figure 5:
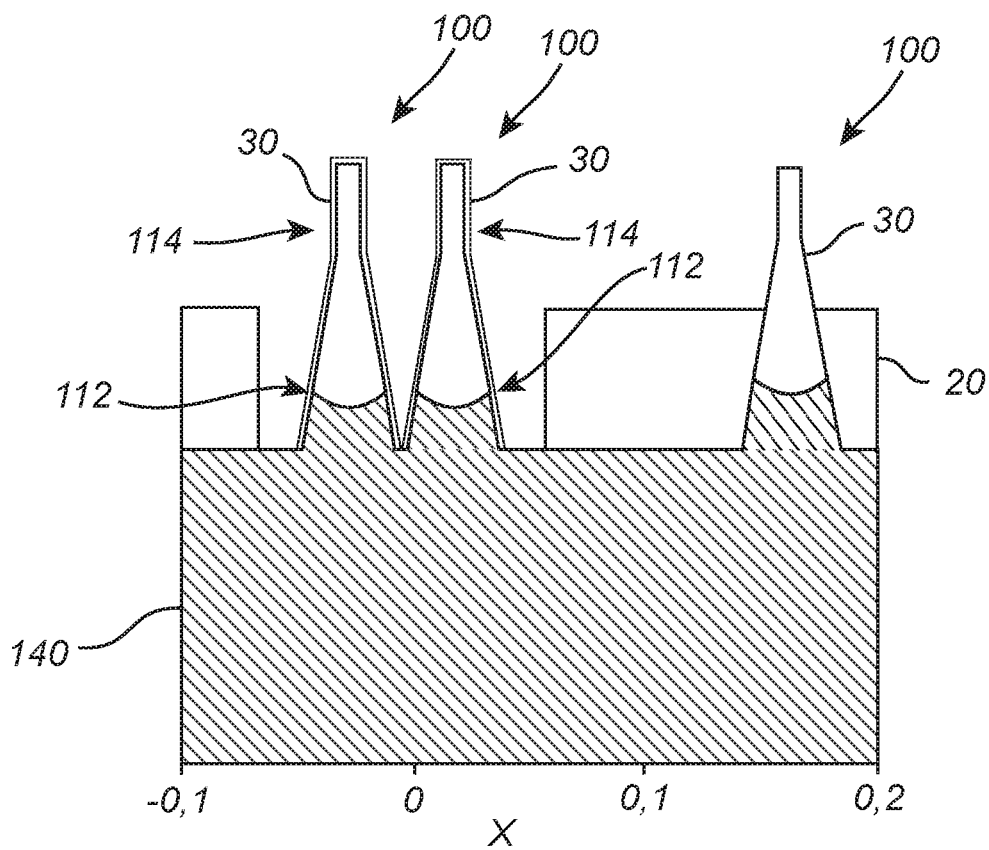

Thereafter, a first metal 30 may be deposited on the top portion 114 of the fin structures 110 and annealed so as to react the first metal 30 to form an outer layer of silicide. The first metal 30 may be titanium, cobalt or nickel platinum, and may for example be added in a layer of a thickness of about 3 nm. The result is illustrated in FIG. 5, showing the fin structures 100 with partly silicided top portions 114 and, in the case of the two left fins that were not protected by the STI layer 20, a silicided layer also at the bottom portions 112. Any remaining first metal 30 at the STI layer 20 may be removed in an etch process.

Figure 6:
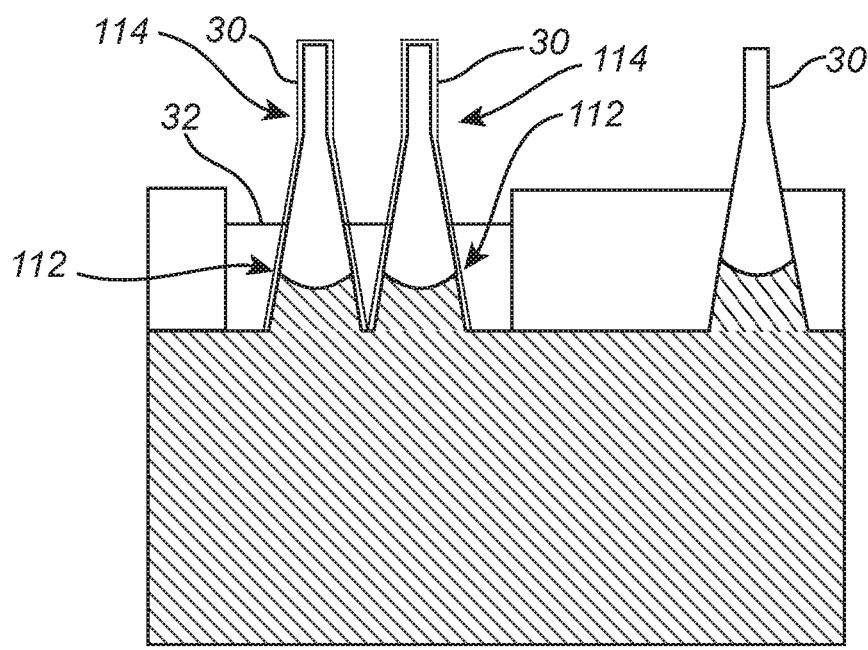

In FIG. 6, a second metal 32 have been provided at the bottom portion 112 of the exposed fin structures 100, in this case in the trenched formed at the two left fin structures 100. The second metal 32 may for example be deposited by conformal coating and recessing until the second silicidation metal 32 remains at the bottom portions 112 that are to be silicided. Example of silicidation metals 32 include titanium, cobalt, and a nickel-platinum alloy.

Figure 7:
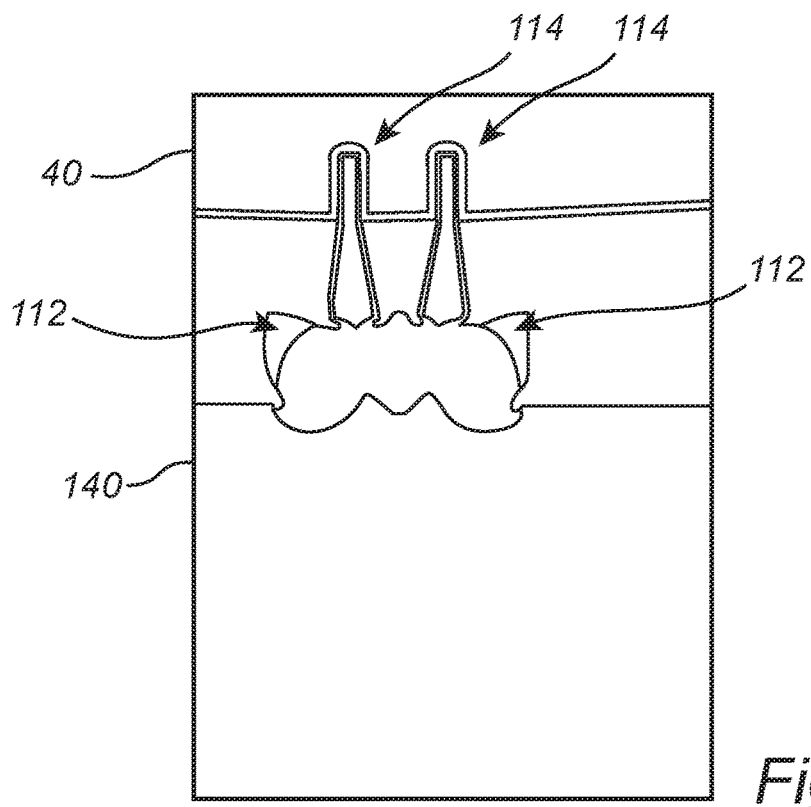

In a subsequent step, following the deposition of the second metal 32 and prior to the annealing of the second metal 32, an isolating/supporting layer, such as an inter-layer dielectric (ILD) 40, may be formed so as to support the fin structures during the silicidation process and reduce deformation. FIG. 7 illustrates an example of the semiconductor device after the second metal 32 has been annealed and formed the silicide with the material of the bottom portion 112 of the fin structure 100. The silicide has been formed throughout the entire bottom portion 112 arranged closest to the substrate 140, and is electrically connected to the substrate 140 through the doped region provided by the PSG 10 described in FIGS. 3 and 4. Due to the relatively thin layer of the first metal 30 that was deposited in connection with FIG. 5, the top portion 114 of the fins remains partly silicided.

Figure 8:
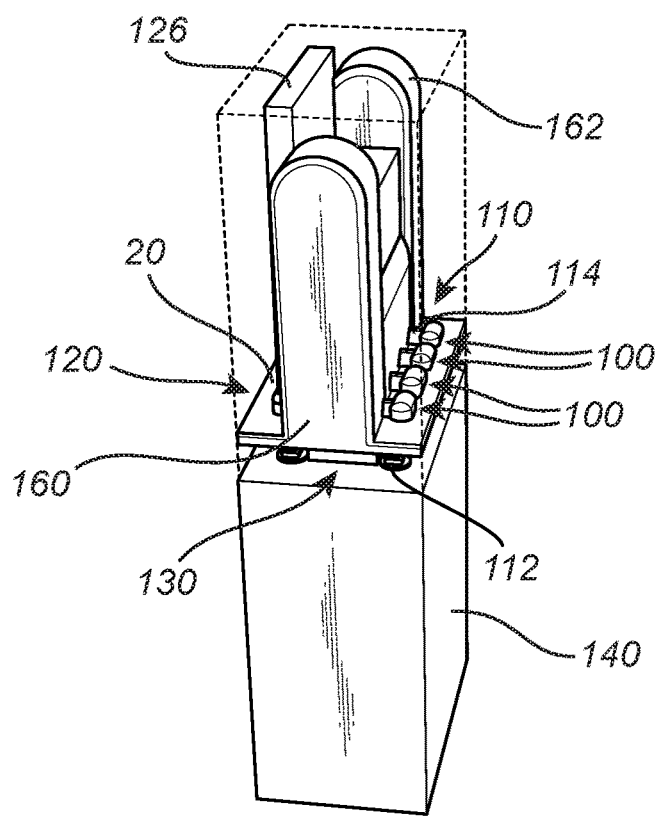
FIG. 8 is a schematic perspective view of a semiconductor device.

FIG. 8 is a perspective view of a semiconductor device according to various embodiments, which may be similarly configured as the devices shown in FIGS. 1 and 2, and which may be formed in a similar process as illustrated in connection with FIGS. 3-7.

FIG. 8 shows four fin structures 100 extending horizontally along a substrate 140. The fin structures 100 and/or the substrate 140 may for example be formed of silicon. The fin structures 100 are embedded in an STI layer 20 of which, for illustrational clarity, only the top surface is illustrated in the present figure.

Each of the fin structures 100 include a first source/drain region 110, a channel region 130 and a second source/drain region 120, the first and second source/drain regions 110, 120 are separated, in the length direction of the fin structure 100, by the channel region 130. The first source/drain region 110 of the fin structures 100 is electrically connected from below, i.e., the substrate side, by a completely silicided bottom portion 112 of the fin. The silicide of the bottom portion 112 may serve as a landing pad for a trench (not shown) connecting the first source/drain portion 110 to a backside contact, such as for example a PDN.

Further, as shown in the present example, the second source/drain regions 120 may be connected from above by means of a second connecting structure 126 extending across the fin structures 100. This may also apply to the channel region 130, which may be coupled to a gate electrode 160 extending along and across the channel regions 130 of the fin structures 100. The gate electrode 160 may be isolated from the connecting structure 126 of the second source/drain regions 120 by means of an isolating spacer 162 arranged at the sidewalls of the gate electrode 160.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A semiconductor device comprising a fin structure and a substrate, the fin structure comprising:
   a first source/drain region;
   a second source/drain region; and
   a channel region arranged between the first source/drain region and the second source/drain region to separate the first source/drain region and the second source/drain region in a length direction of the fin structure,
   wherein the first source/drain region comprises a bottom portion and a top portion, the bottom portion being arranged between the top portion and the substrate such that the bottom portion shares a common boundary with the top portion,
   wherein the bottom portion of the first source/drain region is fully silicided, and
   wherein the top portion of the first source/drain region is partly silicided.

2. The semiconductor device of claim 1, wherein the second source/drain region comprises a top portion which is partly silicided.

3. The semiconductor device of claim 2, further comprising a first connecting structure which electrically contacts at least a part of the bottom portion of the first source/drain region and a second connecting structure which electrically contacts at least a part of the top portion of the second source/drain region.

4. The semiconductor device of claim 3, wherein the first connecting structure electrically contacts the bottom portion of the first source/drain region from a side of the fin structure facing the substrate and the second connecting structure electrically contacts a surface of the top portion of the second source/drain region from a side of the fin structure facing away from the substrate.

5. The semiconductor device of claim 3, wherein at least a part of the top portion of the second source/drain region is provided with an epitaxial contacting structure forming part of the second connecting structure.

6. The semiconductor device of claim 1, wherein the top portion of the first source/drain region comprises a silicided outer layer.

7. The semiconductor device of claim 6, wherein the top portion of the first source/drain region further comprises an inner portion which has a lower metal concentration than the silicided outer layer.

8. The semiconductor device of claim 1, wherein the top portion of the first source/drain region fully overlaps the bottom portion of the first source/drain region in a direction transverse to a main plane of extension of the substrate.

9. The semiconductor device of claim 1, wherein the substrate comprises a well doped with a dopant of a first type, wherein a region of the well sharing a common boundary with the bottom portion of the first source/drain region comprises a higher dopant concentration than other regions of the well, and wherein the top portion of the first and second source/drain regions are doped with a dopant of a second type.

10. A method for forming a semiconductor device, comprising:
    forming a fin structure having a first source/drain region, a second source/drain region and a channel region, wherein the channel region is arranged between the first source/drain region and the second source/drain region, thereby separating the first source/drain region and the second source/drain region in a length direction of the fin structure, and wherein the first source/drain region comprises a bottom portion and a top portion, the bottom portion being arranged between the top portion and a substrate of the semiconductor device such that the bottom portion shares a common boundary with the top portion;
    depositing a first metal on the top portion of the first source/drain region;
    annealing to react the first metal with a material of the top portion of the first source/drain region, such that the top portion of the first source/drain region is partly silicided;
    providing a second metal on the bottom portion of the first source/drain region; and
    annealing to react the second metal with a material of the bottom portion of the first source/drain region, such that the bottom portion of the first source/drain region is fully silicided.

11. The method of claim 10, wherein providing the second metal comprises forming a recess exposing sidewalls of the bottom portion of the first source/drain region and depositing the second metal in the recess.

12. The method of claim 10, further comprising removing the first metal that has not been silicided from portions of the fin structure.

13. The method of claim 10, further comprising depositing an inter-layer dielectric prior to reacting the second metal.

14. The method of claim 10, further comprising doping the substrate to form a well such that a region of the well sharing a common boundary with the bottom portion of the first source/drain region comprises a higher dopant concentration than other regions of the well.

15. The method of claim 14, wherein the doping the substrate comprises forming a recess in the substrate, the recess being positioned adjacent to the fin structure, and at least partly filling the recess with a doped oxide.

16. The method of claim 10, further comprising doping the bottom portion of the first source/drain region with a solid-phase diffusion process.

17. The method of claim 10, further comprising:
    forming a first connecting structure which electrically contacts at least a part of the bottom portion of the first source/drain region; and
    forming a second connecting structure which electrically contacts at least a part of the top portion of the second source/drain region.

18. The method of claim 10, wherein annealing is such that the top portion of the first source/drain region comprises a silicided outer layer.

19. The method of claim 18, wherein annealing is such that the top portion of the first source/drain region further comprises an inner portion which has a lower metal concentration than the silicided outer layer.

* * * * *